(12) United States Patent
Lee et al.

(10) Patent No.: US 9,666,830 B2
(45) Date of Patent: May 30, 2017

(54) ORGANIC LIGHT EMITTING DEVICE AND METHOD FOR MANUFACTURING THE SAME

(71) Applicant: LG Display Co., Ltd., Seoul (KR)

(72) Inventors: Yeon Keun Lee, Daejeon (KR); Sang Jun Park, Daejeon (KR); Yongnam Kim, Daejeon (KR)

(73) Assignee: LG DISPLAY, CO., LTD., Seoul (KR)

( * ) Notice: Subject to any disclaimer, the term of this patent is extended or adjusted under 35 U.S.C. 154(b) by 0 days.

(21) Appl. No.: 14/875,163

(22) Filed: Oct. 5, 2015

(65) Prior Publication Data

US 2016/0027862 A1      Jan. 28, 2016

Related U.S. Application Data

(63) Continuation of application No. PCT/KR2014/003066, filed on Apr. 9, 2014.

(30) Foreign Application Priority Data

Apr. 29, 2013   (KR) .................. 10-2013-0047429

(51) Int. Cl.
*H01L 27/32* (2006.01)
*H01L 51/56* (2006.01)
(Continued)

(52) U.S. Cl.
CPC ...... *H01L 51/5212* (2013.01); *H01L 27/3202* (2013.01); *H01L 27/3279* (2013.01); *H01L 51/5012* (2013.01); *H01L 51/5056* (2013.01); *H01L 51/5072* (2013.01); *H01L 51/5088* (2013.01); *H01L 51/5092* (2013.01);
(Continued)

(58) Field of Classification Search
None
See application file for complete search history.

(56) References Cited

U.S. PATENT DOCUMENTS 6,538,391 B1    3/2003  Suzuki et al.
2006/0202611 A1   9/2006  Hayashi
(Continued)

FOREIGN PATENT DOCUMENTS

CN      101728419 A    6/2010
CN      102354730 A    2/2012
(Continued)

OTHER PUBLICATIONS

Machine translation of JP 2001/196191.*

*Primary Examiner* — Joseph Schoenholtz
(74) *Attorney, Agent, or Firm* — Dentons US LLP

(57) ABSTRACT

Disclosed is an organic light emitting device (OLED) that may include a first electrode including at least two conductive units that are immediately adjacent to each other; a second electrode facing the first electrode; an organic layer between the first electrode and the second electrode; and an auxiliary electrode electrically connected to the first electrode, the auxiliary electrode including at least two branch points that are immediately adjacent to each other, each branch point having at least three branches, wherein a resistance between the at least two branch points is 35Ω or less, and wherein a resistance between the at least two conductive units is 2,000Ω or more and 600,000Ω or less.

34 Claims, 9 Drawing Sheets

(51) Int. Cl.
*H01L 51/50* (2006.01)
*H01L 51/52* (2006.01)

(52) U.S. Cl.
CPC ...... *H01L 51/5096* (2013.01); *H01L 51/5203* (2013.01); *H01L 51/5209* (2013.01); *H01L 51/56* (2013.01); H01L 51/5228 (2013.01); H01L 51/5268 (2013.01); H01L 2227/323 (2013.01); H01L 2251/301 (2013.01); H01L 2251/303 (2013.01); H01L 2251/308 (2013.01); H01L 2251/5361 (2013.01); H01L 2251/5392 (2013.01); H01L 2251/558 (2013.01); H01L 2251/568 (2013.01)

(56) References Cited

U.S. PATENT DOCUMENTS

| | | |
|---|---|---|
| 2010/0097295 A1 | 4/2010 | Kwak |
| 2011/0018112 A1 | 1/2011 | Ogura et al. |
| 2011/0193066 A1 | 8/2011 | Parker et al. |
| 2012/0181933 A1* | 7/2012 | Ma ............... H01L 27/3281 315/121 |
| 2012/0208311 A1 | 8/2012 | Bang et al. |
| 2012/0228591 A1 | 9/2012 | Sawabe et al. |
| 2013/0037827 A1* | 2/2013 | Levermore ......... H01L 27/3202 257/88 |
| 2016/0020429 A1* | 1/2016 | Kuroki ............... H01L 51/5268 257/40 |

FOREIGN PATENT DOCUMENTS

| | | | |
|---|---|---|---|
| EP | 2497810 | A1 | 9/2012 |
| JP | 11339970 | A | 12/1999 |
| JP | 2001-076649 | A | 3/2001 |
| JP | 2001-196191 | A | 7/2001 |
| JP | 2001196191 | A * | 7/2001 |
| JP | 2010-085865 | A | 4/2010 |
| JP | 2010085865 | A * | 4/2010 |
| KR | 10-2006-0097595 | A | 9/2006 |
| KR | 10-2010-0042799 | A | 4/2010 |
| KR | 10-2012-0102534 | A | 9/2012 |
| TW | 201001634 | A | 1/2010 |

* cited by examiner

Figure 3
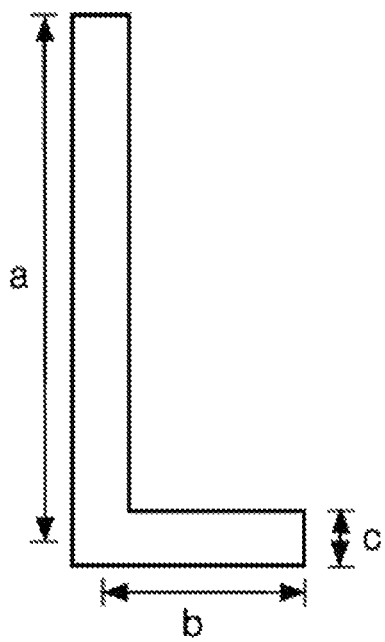
[Figure 4]
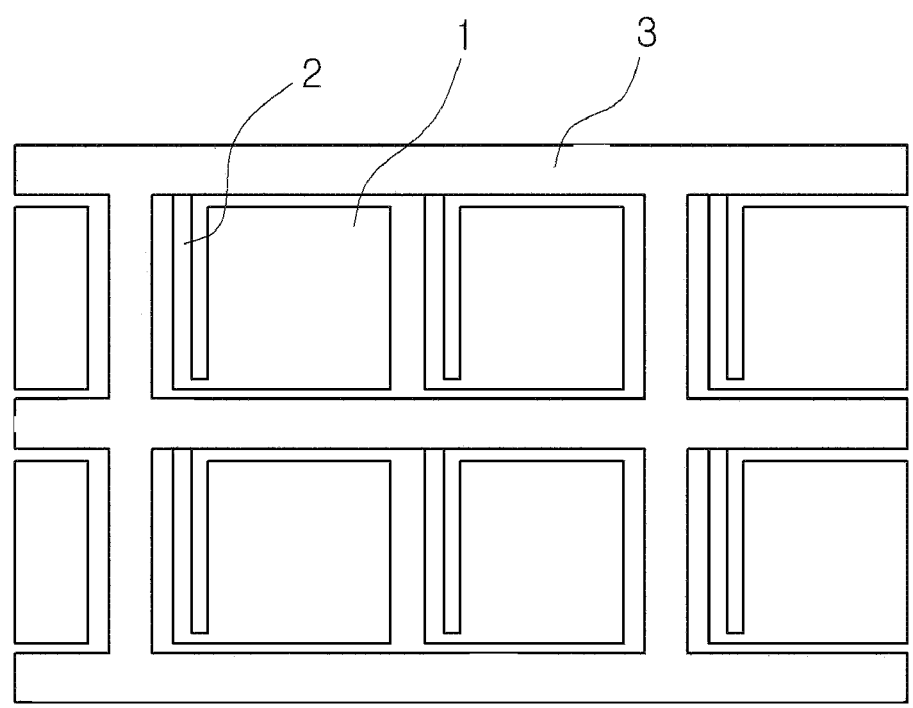

Figure 6
(a)
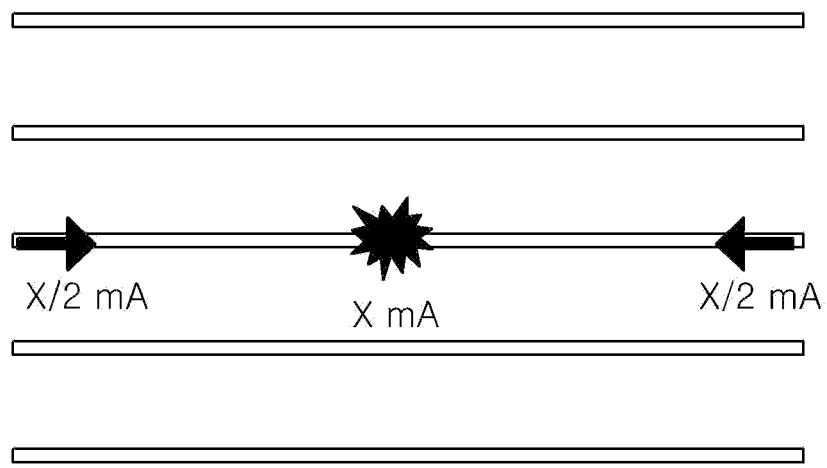
(b)
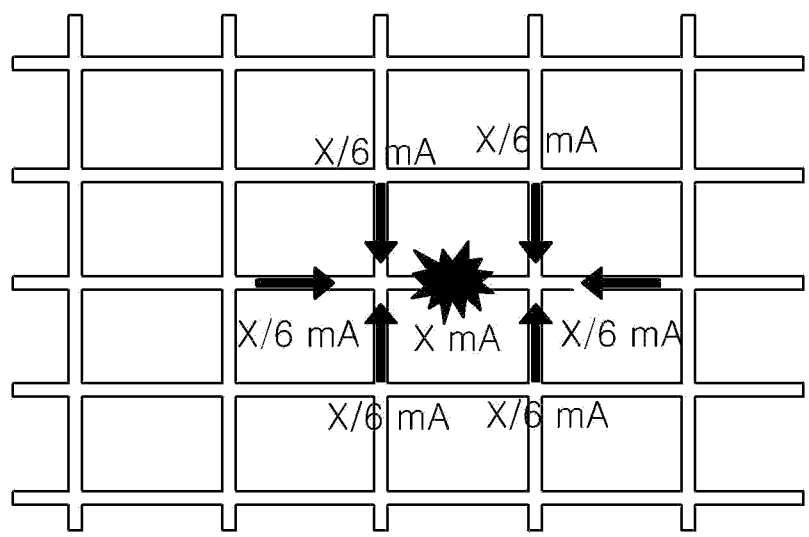

Figure 7
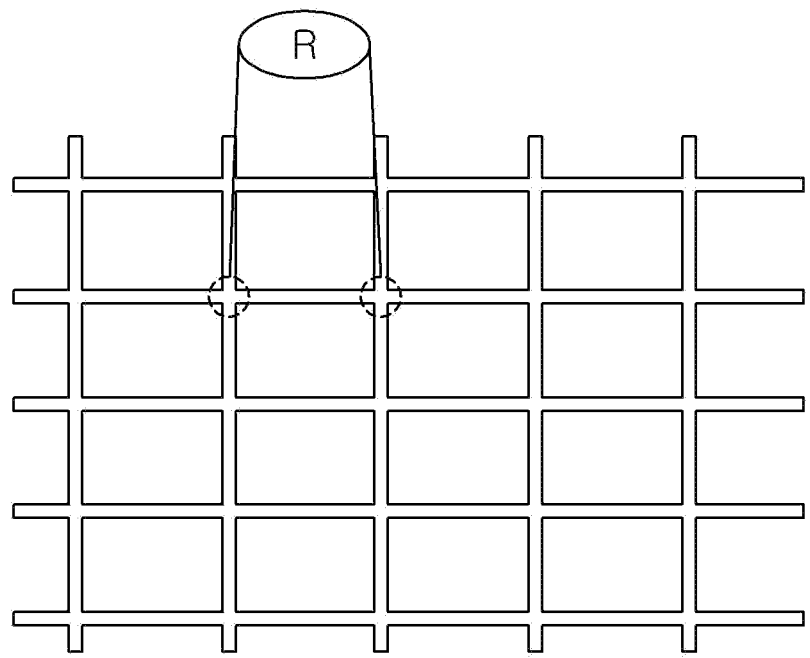
(c)
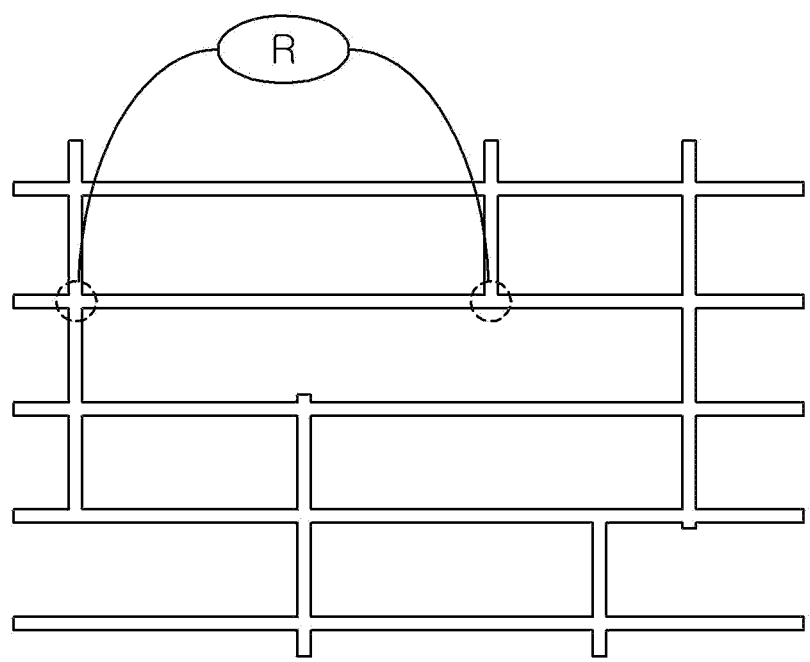
(d)

Figure 8
(e)
(f)
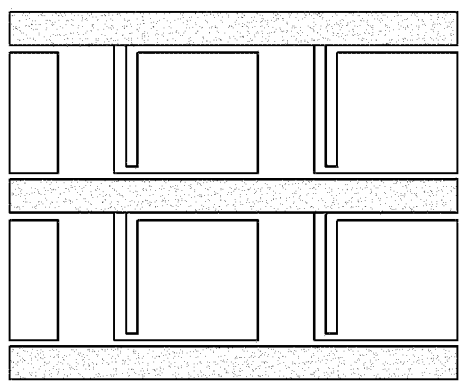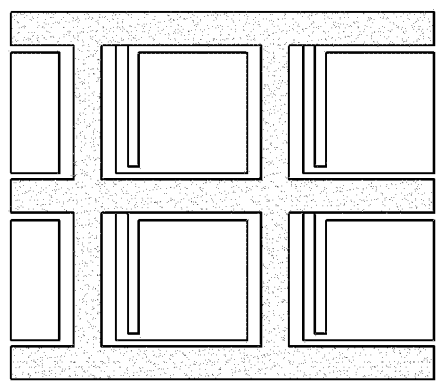
Figure 9
(g)
(h)
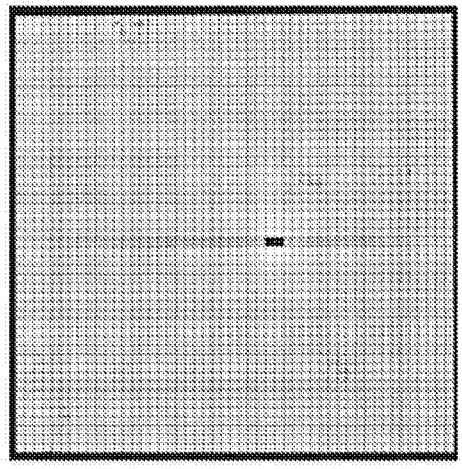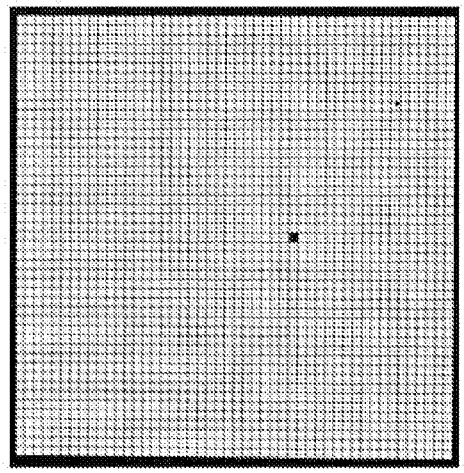

ORGANIC LIGHT EMITTING DEVICE AND METHOD FOR MANUFACTURING THE SAME

This application is a Continuation Bypass of International Application No. PCT/KR2014/003066, filed Apr. 9, 2014, and claims the benefit of Korean Application No. 10-2013-0047429, filed on Apr. 29, 2013, all of which are hereby incorporated by reference in their entirety for all purposes as if fully set forth herein.

TECHNICAL FIELD

The present specification relates to an organic light emitting device (OLED) and a method for manufacturing the OLED.

BACKGROUND ART

An organic light emitting phenomenon refers to a phenomenon of converting electrical energy to light energy using an organic material. That is, when positioning an appropriate organic layer between an anode and a cathode, and then applying a voltage between two electrodes, holes are injected into the organic layer from the anode and electrons are injected into the organic layer from the cathode. Excitons are generated when the injected holes and electrons encounter each other, and light is generated when the excitons fall down to a lower energy state.

Since an interval between the anode and the cathode is small, an organic light emitting device (OLED) is easy to have a short-circuit defect. Due to a pinhole, a crack, a step and coating roughness in a structure of the OLED, and the like, the anode and the cathode may directly contact with each other. The thickness of the organic layer may become thinner in such a defect zone. The defect zone may provide a low resistance path in which current easily flows, thereby reducing or preventing sufficient current from flowing through the OLED in an extreme case. Accordingly, light emitting output of the OLED may decrease or disappear.

In a multi-pixel OLED, such a short-circuit defect may generate a dead pixel of not emitting light or emitting light less than the average light intensity, thereby degrading the display quality. In the case of a lighting or other low resolution usages, a large portion of the OLED device may not operate due to the short-circuit defect.

Due to concerns about the short-circuit defect, manufacturing of an OLED is generally performed in a clean room. However, even a clean environment may not effectively remove the short-circuit defect. In many cases, to decrease the number of short-circuit defects by increasing the interval between two electrodes, the thickness of the organic layer may be unnecessarily increased as compared to a thickness desired to operate the OLED. Such a method may add cost in manufacturing the OLED. Further, the method may not completely remove the short-circuit defect.

SUMMARY OF THE INVENTION

The present invention is to provide an organic light emitting device (OLED) that may operate within a normal range even in a case in which a factor capable of causing a short-circuit defect is present, that is, even in a case in which the short-circuit defect occurs, and a method for manufacturing the OLED.

The present invention is to provide an OLED that may reduce or prevent light intensity of a peripheral area from being degraded due to a voltage drop (IR drop) of a short-circuit occurrence area in a case in which a short-circuit defect occurs, and a method for manufacturing the OLED.

An exemplary embodiment of the present specification is to provide an OLED, including: a first electrode; a second electrode provided to face the first electrode; at least one organic layer provided between the first electrode and the second electrode; and an auxiliary electrode electrically connected to the first electrode, wherein the first electrode includes at least two conductive units, and resistance between the different conductive units is 2,000Ω or more and 600,000Ω or less, and the auxiliary electrode includes at least two branch points each having at least three branches, and resistance between the adjacent branch points is 35Ω or less.

The OLED according to an exemplary embodiment of the present specification may further include a short-circuit preventing portion provided between the conductive unit and the auxiliary electrode, and each conductive unit may be supplied with current through the short-circuit preventing portion.

In the OLED according to an exemplary embodiment of the present specification, the first electrode may further include at least two conductive connectors each including an area in which a length of a direction in which current flows is longer than a width of a vertical direction thereof, one end portion of each conductive connector may be electrically connected to the conductive unit, and another end portion thereof may be electrically connected to the auxiliary electrode.

The OLED according to an exemplary embodiment of the present specification may further include a short-circuit preventing layer provided between the first electrode and the auxiliary electrode, and the auxiliary electrode may be electrically connected to the conductive units through the short-circuit preventing layer.

Another exemplary embodiment of the present specification provides a method for manufacturing the OLED. Specifically, provided is the method for manufacturing the OLED, the method including: preparing a substrate; forming a first electrode including at least two conductive units on the substrate; forming an auxiliary electrode disposed to be separate from the conductive units and at least two branch points each having at least three branches; forming at least one organic layer on the first electrode; and forming a second electrode on the organic layer.

Still another exemplary embodiment of the present specification provides a display device including the OLED.

Still another exemplary embodiment of the present specification provides a lighting device including the OLED.

It is to be understood that both the foregoing general description and the following detailed description are exemplary and explanatory and are intended to provide further explanation of the invention as claimed.

An OLED of the present specification may normally maintain a function of the OLED even though a short circuit occurs due to a defect of a substrate itself.

An OLED of the present specification may stably operate without increasing a leakage current amount even when an area size of a short-circuit occurrence point increases.

An OLED of the present specification may reduce or prevent a decrease in luminescence intensity around an area in which a short-circuit defect occurs.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIG. 3 illustrates an example of a length and a width in a conductive connector of the present specification.

FIGS. 4 and 5 illustrate an example of a configuration in which an auxiliary electrode surrounds a conductive unit according to an exemplary embodiment of the present specification.

FIG. 6 illustrates an example in a case in which a short circuit occurs in a striped auxiliary electrode and in a case in which the short circuit occurs in an auxiliary electrode having at least two branch points according to an example of the present specification.

FIG. 7 illustrates an example of resistance between adjacent branch points of an auxiliary electrode according to an exemplary embodiment of the present specification.

FIG. 8 illustrates a partial area of a state in which a first electrode and an auxiliary electrode are formed during a manufacturing process of an OLED manufactured according to an Example and a Comparative Example of the present specification.

FIG. 9 illustrates a state after causing a short-circuit defect to an OLED manufactured according to the Example of the present specification and the Comparative Example.

DETAILED DESCRIPTION OF THE ILLUSTRATED EMBODIMENTS

Figure 1:
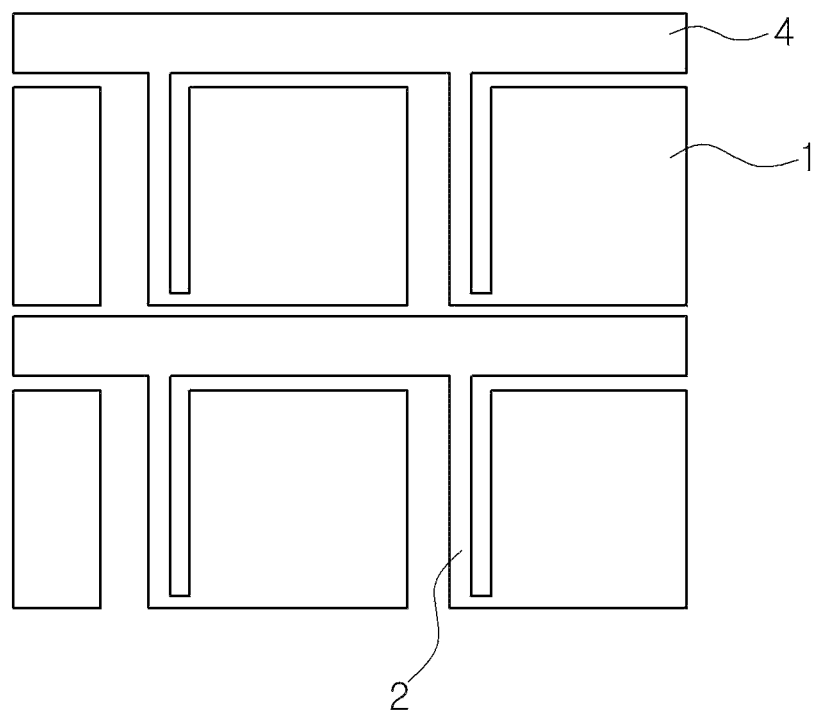
FIGS. 1 and 2 illustrate an example of a patterned first electrode according to an exemplary embodiment of the present specification.

Reference will now be made in detail to embodiments of the present invention, examples of which are illustrated in the accompanying drawings. The same reference numbers may be used throughout the drawings to refer to the same or like parts.

In the following description, when a predetermined member is positioned "on" another member, it may include not only a case in which the predetermined member contacts with the other member but also a case in which other additional member(s) is present between the two members.

An exemplary embodiment of the present specification provides an organic light emitting device (OLED), including: a first electrode; a second electrode provided to face the first electrode; at least one organic layer provided between the first electrode and the second electrode; and an auxiliary electrode electrically connected to the first electrode.

The first electrode includes at least two conductive units, and a resistance between the different conductive units is 2,000Ω or more and 600,000Ω or less.

The auxiliary electrode includes at least two branch points, with each having at least three branches, and a resistance between the adjacent branch points is 35Ω or less.

Current may be supplied to each conductive unit of the present specification through an area having as a short-circuit preventing function. Specifically, according to an exemplary embodiment of the present specification, the OLED may include a short-circuit preventing portion provided between the conductive unit and the auxiliary electrode, and the conductive unit and the auxiliary electrode may be electrically connected through the short-circuit preventing portion.

According to an exemplary embodiment of the present specification, the short-circuit preventing portion may be a conductive connector or a short-circuit preventing layer, or may include the conductive connector and the short-circuit preventing layer.

According to an exemplary embodiment of the present specification, at current density of any one value of 1 mA/cm² to 5 mA/cm², the short-circuit preventing portion may have a resistance value at which an operating voltage increase rate of the following Formula 1 and a numerical value of operating current to leakage current of the following Formula 2 simultaneously satisfy 0.03 or less:

$$\frac{V_t - V_o}{V_o} \qquad \text{[Formula 1]}$$

$$\frac{I_s}{I_t} \qquad \text{[Formula 2]}$$

wherein $V_t(V)$ denotes operating voltage of the OLED to which the short-circuit preventing portion is applied and in which a short circuit defect is absent, $V_o(V)$ denotes operating voltage of the OLED to which the short-circuit preventing portion is not applied and in which the short-circuit defect is absent, $I_t(mA)$ denotes operating current of the OLED to which the short-circuit preventing portion is applied and in which the short-circuit defect is absent, and $I_s(mA)$ denotes leakage current of the OLED to which the short-circuit preventing portion is applied and in which the short-circuit defect is present in any one conductive unit.

$V_o(V)$ may denote operating voltage in a case in which the short-circuit defect is absent in an OLED of which a remaining configuration excluding only the short-circuit preventing portion is the same.

Resistance or a resistance value of the short-circuit preventing portion may denote resistance from one end portion of the short-circuit preventing portion to the other end portion thereof. Specifically, the resistance or the resistance value of the short-circuit preventing portion may be resistance from the conductive unit to the auxiliary electrode.

A process of inducing the resistance value of the short-circuit preventing portion at which the operating voltage increase rate of the above Formula 1 and the numerical value of operating current to leakage current of the above Formula 2 simultaneously satisfy 0.03 or less is as follows.

In a state in which the short circuit defect is absent, the operating current $I_t(mA)$ of the OLED may be expressed as the following formula.

$$I_t = n_{cell} \times I_{cell}$$

$n_{cell}$ denotes the number of conductive units corresponding to a light emitting area in the OLED.

$I_{cell}$ denotes current (mA) operating in one conductive unit in a case in which the OLED normally operates.

Each conductive unit is connected in parallel and thus, resistance $(R_{org})(\Omega)$ applied to the entire OLED may be expressed as follows.

$$R_{org} = \frac{R_{cell-org}}{n_{cell}}$$

$R_{cell-org}(\Omega)$ denotes organic resistance $(\Omega)$ in one conductive unit.

Compared to a case in which the short-circuit preventing portion is absent, operating voltage increases in the OLED including the short-circuit preventing portion. Accordingly, when the short-circuit preventing portion is applied, the short-circuit preventing portion is designed such that the efficiency of the OLED is not greatly degraded.

In a normal operation state of the OLED, the operating voltage increase rate occurring when the short-circuit preventing portion is added may be expressed as the following Formula 1.

$$\frac{V_t - V_o}{V_o} \qquad \text{[Formula 1]}$$

In the above Formula 1, $V_t(V)$ denotes operating voltage of the OLED to which the short-circuit preventing portion is applied and in which the short circuit defect is absent and $V_o(V)$ denotes operating voltage of the OLED to which the short-circuit preventing portion is not applied and in which the short circuit defect is absent.

The operating voltage increase rate $((V_t - V_o)/V_o)$ may be calculated according to the following formula.

$$\frac{V_t - V_o}{V_o} = \frac{R_{cell-spl}}{n_{cell-org}}$$

$R_{cell-spl}$ denotes resistance $(\Omega)$ of the short-circuit preventing portion in one conductive unit.

$R_{cell-org}$ denotes organic resistance $(\Omega)$ in one conductive unit.

The operating voltage increase rate $((V_t - V_o)/V_o)$ may be induced through the following formula.

$$V_o = \frac{I_t \times (R_{org})}{1000}$$

$$V_t = I_{cell} \times \frac{(R_{cell-org} + R_{cell-spl})}{1000}$$

In the case of the OLED in which the short-circuit preventing portion is absent, when defining, as $I_n$, current (mA) flowing through a normal organic layer in the case of the short-circuit occurrence, defining, as $I_s$, leakage current (mA) flowing into a short-circuit occurrence point, and defining, as $R_{org-s}$, organic resistance $(\Omega)$ of the short-circuit occurrence point, $I_n$ and $I_s$ may be expressed as follows.

$$I_n = \frac{V_0}{R_{org}} = I_t \times \frac{R_{org} \times R_{org-s}}{R_{org} + R_{org-s}} \times \frac{1}{R_{org}} = 0$$

$$I_s = \frac{V_0}{R_{org-s}} = I_t \times \frac{R_{org} \times R_{org-s}}{R_{org} + R_{org-s}} \times \frac{1}{R_{org-s}} = I_t \times \frac{R_{org}}{R_{org} + R_{org-s}} = I_t$$

That is, in a case in which the short circuit occurs in a partial area of the OLED in which the short circuit-preventing portion is absent, all the set current may escape through the short-circuit area $(I_s)$ while $R_{org-s}$, drops to a value close to "0". Accordingly, in the case of the OLED in which the short-circuit preventing portion is absent, if the short circuit occurs, the current may not flow in the normal organic layer and thus, the OLED may not emit light.

In the case of the OLED in which the short-circuit preventing portion is provided, when defining $I_{n-cell}$ as current (mA) flowing through a normal light emitting area in the case of the short-circuit occurrence, voltage of each parallel-connected conductive unit is identical and a sum of currents of all of the parallel-connected conductive units is identical to operating current $(I_t)$ of the OLED. It may be verified from the following formula.

$$(R_{cell-org} + R_{cell-spl}) \times I_{n-cell} = (R_{cell-s} + R_{cell-spl}) \times I_s$$

$$I_t = I_{n-cell} \times (n_{cell} - 1) + I_s$$

Also, in the case of the OLED in which the short-circuit preventing portion is provided, the leakage current flowing into the short-circuit occurrence point may be calculated as follows.

$$I_s = I_t \times \frac{(R_{cell-org} + R_{cell-spl})}{(R_{cell-org} + R_{cell-spl}) + (n_{cell} - 1) \times (R_{cell-s} + R_{cell-spl})}$$

Accordingly, in the OLED according to an exemplary embodiment of the present specification in which the short-circuit preventing portion is provided, even though the organic layer of any one conductive unit is short circuited $(R_{cell-s} = 0)$, it may be possible to significantly decrease an amount of leakage current when a value of a denominator sufficiently increases, which can be verified from the above formula.

The numerical value of the operating current $(I_t)$ to the leakage current $(I_s)$ of the OLED in which the short-circuit preventing portion is provided may be expressed as the following Formula 2.

$$\frac{I_s}{I_t} \qquad \text{[Formula 2]}$$

In the above Formula 2, $I_t(mA)$ denotes the operating current of the OLED to which the short-circuit preventing portion is applied and in which the short-circuit defect is absent, and $I_s(mA)$ denotes the leakage current of the OLED to which the short-circuit preventing portion is applied and in which the short-circuit defect is present in any one conductive unit.

Further, the appropriate numerical value range of the operating current $(I_t)$ to the leakage current $(I_s)$ of the OLED in which the short-circuit preventing portion is provided may be calculated through the following formula.

$$\frac{I_s}{I_t} = \frac{(R_{cell-org} + R_{cell-spl})}{(R_{cell-org} + R_{cell-spl}) + (n_{cell} - 1) \times (R_{cell-s} + R_{cell-spl})}$$

According to an exemplary embodiment of the present specification, the short-circuit preventing portion may have a resistance value at which the operating voltage increase rate $((V_t-V_o)/V_o)$ and the numerical value of the operating current to the leakage current $(I_s/I_t)$ of the OLED simultaneously satisfy 0.03 or less. More specifically, the short-circuit preventing portion may have a resistance value at which the operating voltage increase rate $((V_t-V_o)/V_o)$ and the numerical value of the operating current to the leakage current $(I_s/I_t)$ simultaneously satisfy 0.01 or less.

Specifically, according to an exemplary embodiment of the present specification, in the above Formula 1 and the above Formula 2, the current density in the case of operation of the OLED may be any one value of 1 mA/cm² to 5 mA/cm².

According to an exemplary embodiment of the present specification, resistance between one conductive unit and another conductive unit may be 2,000Ω or more and 600,000Ω or less. Specifically, the resistance value includes resistance from the one conductive unit to the other conductive unit through the short-circuit preventing portion if it exists. That is, that the resistance between the different conductive units is 2,000Ω or more and 600,000Ω or less indicates that each conductive unit is electrically connected to the short-circuit preventing portion and thereby is supplied with the current. The resistance between one conductive unit and another conductive unit adjacent to each other can be measured by probing substantially center points of the two conductive units.

The conductive unit according to an exemplary embodiment of the present specification may be included in a light emitting area of the OLED. Specifically, according to an exemplary embodiment of the present specification, at least an area of each conductive unit may be positioned on the light emitting area of the OLED. That is, according to an exemplary embodiment of the present specification, a light emitting phenomenon may occur on an organic layer including a light emitting layer formed on an area that constitutes the conductive unit, and light may be emitted through the conductive unit.

According to an exemplary embodiment of the present specification, the current of the OLED may flow in the auxiliary electrode, the short-circuit preventing layer, the conductive unit, the organic layer, and the second electrode, and may flow in a reverse direction thereof. Alternatively, the current of the OLED may flow in the auxiliary electrode, the conductive connector, the conductive unit, the organic layer, and the second electrode, and may flow in a reverse direction thereof. Alternatively, the current of the OLED may flow in the auxiliary electrode, the short-circuit preventing layer, the conductive connector, the conductive unit, the organic layer, and the second electrode, and may flow in a reverse direction thereof.

According to an exemplary embodiment of the present specification, each conductive unit may be supplied with current from the auxiliary electrode through the short-circuit preventing portion.

The light emitting area indicates an area in which light emitted from the light emitting layer of the organic layer is emitted through the first electrode and/or the second electrode. For example, in the OLED according to an exemplary embodiment of the present specification, the light emitting area may be formed on at least a portion of an area of the first electrode in which the short-circuit preventing portion and/or the auxiliary electrode are not formed in an area in which the first electrode is formed on the substrate. Also, a non-emitting area indicates a remaining area excluding the light emitting area.

According to an exemplary embodiment of the present specification, the short-circuit preventing portion may be positioned on the non-emitting area of the OLED.

According to an exemplary embodiment of the present specification, each conductive unit may be electrically connected in parallel. The conductive units may be disposed to be separate from each other. A configuration in which the conductive units are separate from each other may be verified from resistance between the conductive units.

Specifically, according to an exemplary embodiment of the present specification, resistance from the one conductive unit to another conductive unit adjacent thereto may be at least two folds of resistance of the short-circuit preventing portion. For example, in a case in which a current carrying path between any one conductive unit and another conductive unit adjacent thereto is constituted merely through the short-circuit preventing portion and the auxiliary electrode, the conductive unit and the other conductive unit adjacent thereto pass through the auxiliary electrode and the short-circuit preventing portion twice. Accordingly, even though a resistance value of the auxiliary electrode is ignored, the resistance between the conductive units may have a resistance value corresponding to at least two folds of the short-circuit preventing portion.

That is, according to an exemplary embodiment of the present specification, resistance from each conductive unit to the auxiliary electrode may be 1,000Ω or more and 300,000Ω or less.

According to an exemplary embodiment of the present specification, in a case in which the conductive units are directly electrically connected to each other instead of being disposed to be separate from each other, a resistance value of the directly connected area may be higher than a resistance value of the short-circuit preventing portion. In this case, even though the conductive units are not disposed to be completely separate from each other, it may be possible to maintain a normal short-circuit preventing function in a case in which a short circuit occurs.

The conductive units may be separate from each other and thereby electrically separate from each other. Each conductive unit may be supplied with current from the auxiliary electrode through the short-circuit preventing portion. This may reduce or prevent the overall non-operation of the OLED from occurring when current that is to flow in another conductive unit in which the short circuit is absent flows in a conductive unit in which the short circuit is present, in a case in which the short circuit occurs in any one conductive unit.

According to an exemplary embodiment of the present specification, the first electrode may further include the conductive connector having the short-circuit preventing function.

Specifically, according to an exemplary embodiment of the present specification, the first electrode may further include at least two conductive connectors each including area in which a length of a direction in which current flows is longer than a width of a vertical direction thereof. One end portion of each conductive connector may be electrically connected to the conductive unit and another end portion thereof may be electrically connected to the auxiliary electrode.

Specifically, according to an exemplary embodiment of the present specification, the conductive connector may include an area in which a ratio of the length to the width is 10:1 or more.

The conductive connector may be an end portion of the conductive unit in the first electrode and a shape or a position thereof is not particularly limited. For example, in a case in which the conductive unit is formed in a flattened "U" shape or an "L" shape, the conductive connector may be an end portion of the conductive unit. Alternatively, the conductive connector may have a shape that is protruded from one vertex, one corner, or a middle portion of one side of the conductive unit in a polygonal shape such as a rectangular shape.

Alternatively, according to an exemplary embodiment of the present specification, the first electrode may further include the conductive connector including the short-circuit preventing function and the current carrying portion of the first electrode configured to electrically connect the conductive connectors. In this case, the auxiliary electrode may be electrically connected to the conductive connector through the current carrying portion of the first electrode. Specifically, the auxiliary electrode may be provided on the current carrying portion of the first electrode.

According to an exemplary embodiment of the present specification, the current carrying portion of the first electrode or the auxiliary electrode may be provided to be separate from the conductive unit.

"On the current carrying portion" may also indicate one side surface of the current carrying portion in addition to only a top surface of the current carrying portion. Also, "on the current carrying portion" may also indicate one area of a top surface, a bottom surface, or a side surface of the current carrying portion. Also, "on the current carrying portion" may also include one area of the top surface of and one area of the side surface of the current carrying portion, and may include one area of the bottom surface and one area of the side surface of the current carrying portion.

The current carrying portion of the first electrode of the present specification may function to physically connect each conductive connector and to flow current in each conductive unit through each conductive connector.

The conductive units may be physically connected by the current carrying portion of the first electrode and the conductive connector through a patterning process of the first electrode, and may be electrically connected in parallel. An example thereof is illustrated in FIG. 1.

Referring to FIG. 1, a patterned first electrode includes a conductive unit 1 and a conductive connector 2 and the patterned first electrode is physically connected to a current carrying portion 4 of the first electrode.

Each conductive unit may be supplied with current from the auxiliary electrode through the conductive connector. Alternatively, the conductive unit may be supplied with the current through an auxiliary electrode and a current carrying portion of the first electrode.

The conductive connector may be patterned in a form of being connected to each conductive unit through a patterning process of the first electrode. An example thereof is illustrated in FIG. 2.

Figure 2:
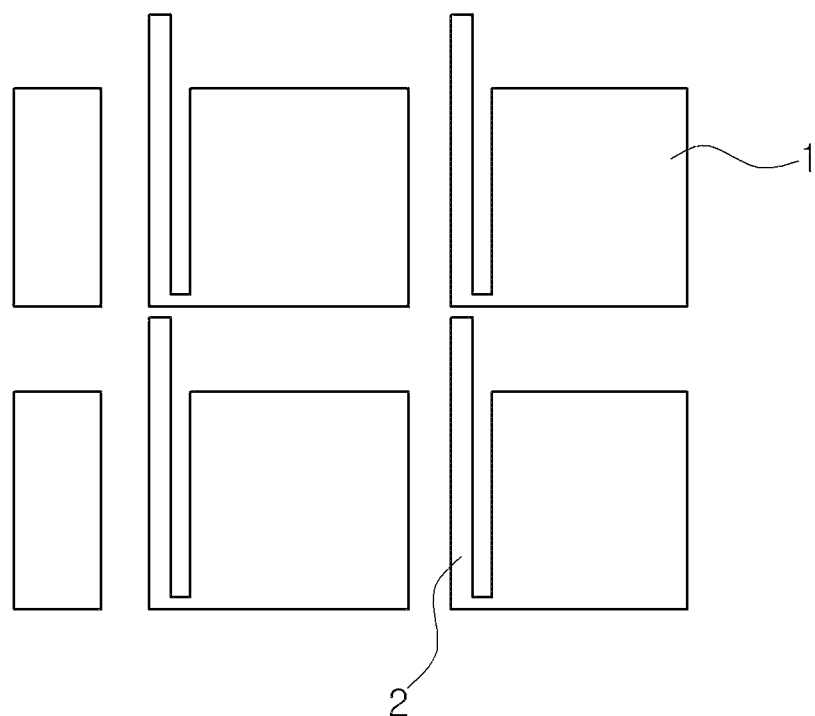

Referring to FIG. 2, the patterned first electrode includes the conductive unit 1 and the conductive connector 2.

The conductive connector may have a relatively high resistance compared to the conductive unit. Further, the conductive connector may perform a short-circuit preventing function in the OLED. That is, even when a short-circuit defect occurs due to a short circuit occurring in the OLED, the conductive connector may function to enable an operation of the OLED.

According to an exemplary embodiment of the present specification, a material of the conductive connector may be the same as a material of the conductive unit. Specifically, the conductive connector and the conductive unit are included in the first electrode and thus, may be formed using the same material.

The short-circuit defect may occur in a case in which the second electrode directly contacts with the first electrode. Alternatively, the short-circuit defect may occur even in a case in which due to a decrease in a thickness or deformation of the organic layer disposed between the first electrode and the second electrode, a function of the organic layer is lost and thereby the first electrode and the second electrode contact with each other. When the short circuit defect occurs, a low current path may be provided to the OLED, thereby enabling the OLED to anomalously operate. Due to a leakage current that directly flows from the first electrode to the second electrode by the short-circuit defect, current of the OLED may flow avoiding a zero-defect zone. It may decrease the light emitting output of the OLED. In a serious case, the OLED may not operate. Also, when current distributed and thereby flowing over a wide area of organic materials is concentrated and thereby flows at a short-circuit occurrence point, high heat may be locally generated so that the OLED may be broken or a fire may occur.

However, even when the short-circuit defect occurs in any one or more conductive units among the conductive units of the OLED according to an exemplary embodiment of the present specification, it may be possible to prevent all the driving current from flowing in a short-circuit defect portion using the conductive connector. That is, the conductive connector may perform a role of controlling an amount of leakage current not to unlimitedly increase. Accordingly, even when the short-circuit defect occurs in a portion of the conductive units of the OLED, remaining conductive units in which the short-circuit defect is absent may normally operate.

The conductive connector has a high resistance value. Therefore, in a case in which the short-circuit defect occurs, the conductive connector may provide an appropriate resistance, thereby reducing or preventing the current from leaking through the short-circuit defect portion. To this end, the conductive connector may have a resistance value suitable for decreasing the leakage current caused by the short-circuit defect and the light emitting efficiency loss associated therewith.

According to an exemplary embodiment of the present specification, the conductive connector may have a resistance value capable of reducing or preventing the short-circuit defect by including a portion in which a ratio of the length to the width is 10:1 or more. Further, according to an exemplary embodiment of the present specification, the portion in which the ratio of the length to the width is 10:1 or more may be an entire area of the conductive connector. Alternatively, the area in which the ratio of the length to the width is 10:1 or more may be a partial area of the conductive connector.

The length and the width are relative concepts and thus, the length indicates a spatial distance from one end of the conductive connector to the other end thereof from view of an upper portion. That is, even though the conductive connector is a combination of straight lines or includes a curve, the length indicates a value obtained by measuring the length based on the assumption that the length is a straight line. The width indicates a distance from a center of a lengthwise direction of the conductive connector to both ends of a vertical direction thereof from view of an upper portion. Also, when the width varies, it may be an average value of a width of any one conductive connector. An example of the length and the width is illustrated in FIG. 3.

The length indicates a dimension of a direction in which the current flows. Also, the width of the present specification indicates a dimension of a direction vertical to the direction in which the current flows.

The length indicates a travel distance of the current from the current carrying portion of the first electrode or the auxiliary electrode to the conductive unit. The width indicates a distance vertical to the lengthwise direction.

In FIG. 3, the length may be a summation of "a" and "b", and the width may be "c".

According to an exemplary embodiment of the present specification, resistance of the conductive connector may satisfy the following Formula 3:

(Length of conductive connector+width of conductive connector)×surface resistance of conductive connector≈1,000Ω [Formula 3]

The length of the conductive connector may be a length from one end portion of the conductive connector to the other end portion thereof as a length of a direction in which current flows in the conductive connector. Also, the width of the conductive connector indicates a width of a direction vertical to the length of the conductive connector and indicates an average value of the width in a case in which the width of the conductive connector is not constant.

That is, according to an exemplary embodiment of the present specification, the resistance of the conductive connector may be 1,000Ω or more. Specifically, the resistance of the conductive connector may be 1,000Ω or more and 300,000Ω or less.

In a case in which the resistance of the conductive connector is within the above range, the conductive connector may perform an appropriate short-circuit preventing function for the occurrence of the short-circuit defect. That is, in a case in which the resistance of the conductive connector is 1,000Ω or more, it may possible to effectively prevent the leakage current from flowing in an area in which the short-circuit defect is present.

According to an exemplary embodiment of the present specification, resistance from the current carrying portion of the first electrode or the auxiliary electrode to the conductive unit may be 1,000Ω or more and 300,000Ω or less.

According to an exemplary embodiment of the present specification, resistance between different conductive units indicates resistance reaching the one conductive unit and a short-circuit preventing portion contacting therewith, the auxiliary electrode, a short-circuit preventing portion contacting with another conductive unit, and the other conductive unit.

According to the above Formula 3, the resistance indicates a lower limit value of resistance at which the conductive connector may perform the short-circuit preventing function in a case in which the conductive unit is supplied with the current through the conductive connector.

The auxiliary electrode according to an exemplary embodiment of the present specification may include at least two branch points. Each branch point may include at least three branches. The auxiliary electrode does not include conductive lines that are not electrically connected to each other, and the auxiliary electrode may be provided in a form in which at least two conductive lines partially contact with each other. That is, the auxiliary electrode is not provided in a stripe shape and may be provided in a form including an area in which at least two conductive lines intersect each other.

The branch point indicates an area in which the auxiliary electrodes contact with each other and thereby form at least three branches. Through the branch points, the current of the auxiliary electrode may distributedly flow in the branches.

According to an exemplary embodiment of the present specification, the auxiliary electrode may be disposed to be separate from the conductive units and provided in a mesh structure of surrounding at least one conductive unit.

According to an exemplary embodiment of the present specification, the auxiliary electrode may be disposed to be separate from the conductive unit; and an area excluding the end portion of the conductive connector in contact with the auxiliary electrode. Specifically, the auxiliary electrode may not be provided on an area of performing the short-circuit preventing function of the conductive connector. That is, the auxiliary electrode may need to be separate from an area in which a length of a direction in which the current of the conductive connector flows is longer than a width of a vertical direction thereof. This is because a resistance value decreases and the short-circuit preventing function is degraded when the auxiliary electrode having a low resistance value contacts an area having a high resistance value.

Figure 5:
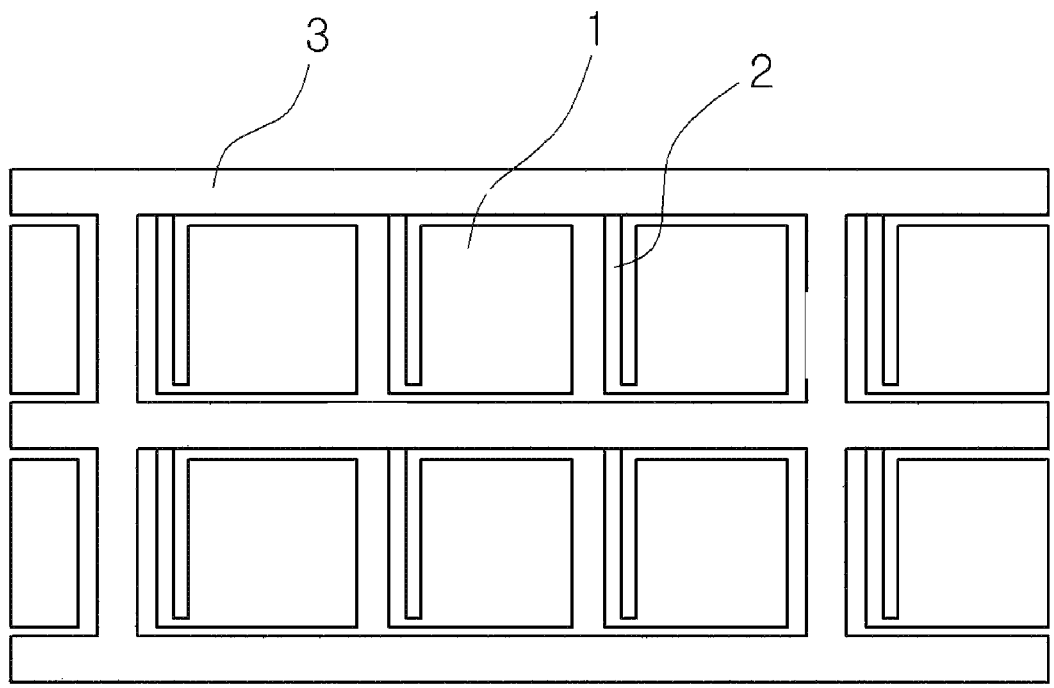

FIGS. 4 and 5 illustrate an example of a configuration in which an auxiliary electrode surrounds a conductive unit according to an exemplary embodiment of the present specification.

Referring to FIGS. 4 and 5, the auxiliary electrode is disposed to be separate from the conductive unit and is electrically connected to one end portion of the conductive connector.

In a case in which a short-circuit defect occurs in a local area of the OLED employing a short-circuit preventing function, when the auxiliary electrode is provided in a striped shape, a light intensity of a peripheral portion of the local area in which the short-circuit defect occurs may be decreased. Compared to a normal operation, an amount of current as much as about 100 folds may flow in the local area in which the short-circuit defect occurs, whereby a great voltage drop (IR drop) phenomenon occurs in the auxiliary electrode of the local area in which the short-circuit defect occurs. That is, it may be possible to prevent the entire OLED from not operating using the short-circuit preventing function. Also, the local area in which the short-circuit defect occurs may become dark and thus, the product quality may be significantly degraded.

Accordingly, in the OLED according to an exemplary embodiment of the present specification, the auxiliary electrode includes at least two branch points each having at least three branches, thereby enabling the current to be distributed over a wide area in a case in which a short circuit occurs. That is, the auxiliary electrode is designed such that the voltage drop (IR drop) occurring in the auxiliary electrode of the short-circuit occurrence area can be reduced or minimized and thus, a light intensity of the OLED may be uniform even when such a short-circuit defect occurs.

FIG. 6 compares (a) a case in which a short circuit occurs in a striped auxiliary electrode and (b) a case in which the short circuit occurs in an auxiliary electrode having at least two branch points according to an exemplary embodiment of the present invention. In FIG. 6, X mA indicates the leakage current in a case in which a short-circuit occurs.

Referring to FIG. 6, in a case in which a short circuit occurs, the auxiliary electrode has a greater effect in distributing the current over a wide area compared to the striped auxiliary electrode.

According to an exemplary embodiment of the present specification, resistance between adjacent branch points of the auxiliary electrode may be 35Ω or less. Specifically, the resistance between the adjacent branch points of the auxiliary electrode may be 18Ω or less. Also, the resistance between the adjacent branch points of the present specification may be 0Ω or more.

Alternatively, according to an exemplary embodiment of the present specification, a distance between the adjacent branch points of the auxiliary electrode may be 21 mm or less. Specifically, the distance between the adjacent branch points may be 0.2 mm or more and 21 mm or less.

According to an exemplary embodiment of the present specification, the distance between the adjacent branch points of the auxiliary electrode may be 10 mm or less, or may be 0.2 or more and 10 mm or less.

According to an exemplary embodiment of the present specification, the distance between the adjacent branch points of the auxiliary electrode may be 10 mm or less and the resistance between the adjacent branch points may be 18Ω or less.

In a case in which the resistance between the adjacent branch points of the auxiliary electrode and/or the distance between the adjacent branch points is within the above range, the distribution of the current may be easily performed for the short-circuit occurrence and the voltage drop (IR drop) may be minimized. A detailed description related thereto may be more clearly understood by the following Example and Comparative Example.

FIG. 7 illustrates an example of resistance between adjacent branch points of an auxiliary electrode according to an exemplary embodiment of the present specification. Specifically, FIG. 7 illustrates an example of adjacent branch points. In a case of measuring a resistance between the adjacent branch points, a measurement is performed in a state in which all of the detour-able auxiliary electrodes between the adjacent branch points are excluded.

The following Example shows that more than 10% of non-uniformity of luminance, which is caused by a short circuit occurrence, may not occur in an OLED according to an exemplary embodiment of the present specification.

The distance between the adjacent branch points of the auxiliary electrode of the OLED and the resistance range between the adjacent branch points will now be described.

Figure 12:
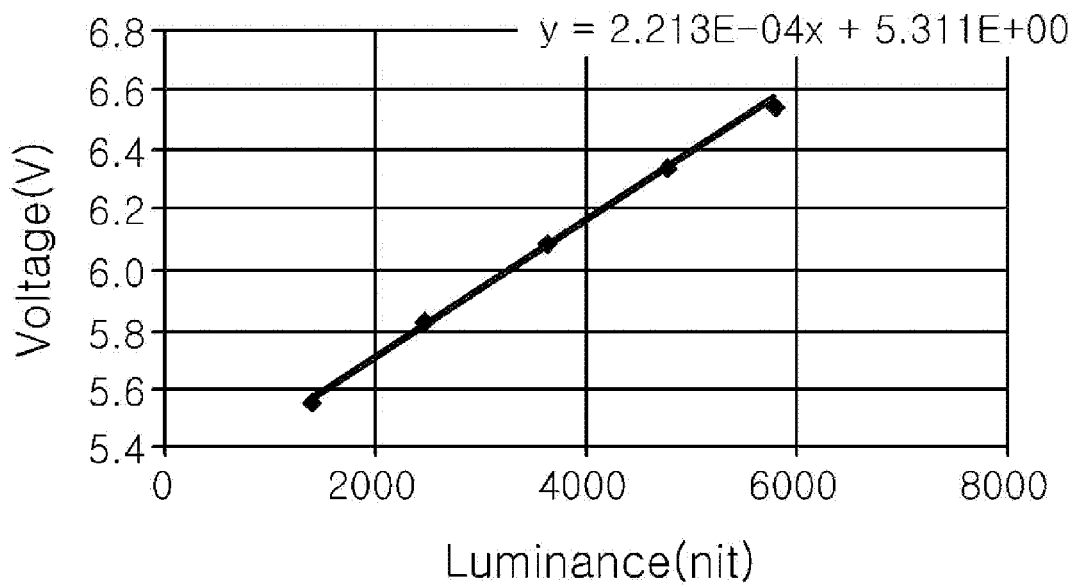
FIG. 12 illustrates a driving characteristic of an OLED according to the present specification.

FIG. 12 illustrates a driving characteristic of an OLED according to an exemplary embodiment of the present specification. FIG. 12 shows brightness according to operating voltage of the OLED.

In a case in which the operating voltage of the OLED is 6V, the luminance may be around 3000 nit and a brightness variation of 10% may be around 2700 nit. Further, an operating voltage difference between 3000 nit and 2700 nit is 0.066 V. Also, for the brightness variation of 5%, the operating voltage difference is 0.033 V.

According to an exemplary embodiment of the present specification, in a case in which the OLED is short circuited, the voltage drop is desired to be 0.066V or less in order to achieve the luminance non-uniformity within 10% of a normal operation. To generate only the voltage drop of 0.066V or less, the resistance between the adjacent branch points of the auxiliary electrode connected to the conductive unit in which the short circuit occurs is desired to be 35Ω or less. Alternatively, the voltage drop may also be reduced by increasing a width of the auxiliary electrode or by introducing another branch point before the distance between the branch points exceeds 21 mm for additionally distributing the current.

According to an exemplary embodiment of the present specification, in a case in which the OLED is short-circuited, the voltage drop is desired to be 0.033V or less in order to achieve the luminance non-uniformity within 5% of the normal operation. To generate only the voltage drop of 0.033V or less, the resistance between the adjacent branch points of the auxiliary electrode connected to the conductive unit in which the short circuit occurs is desired to be 18Ω or less. Alternatively, the voltage drop may also be reduced by increasing a width of the auxiliary electrode or by introducing another branch point before the distance between the branch points exceeds 10 mm for additionally distributing the current.

According to an exemplary embodiment of the present specification, the surface resistance of the auxiliary electrode may be 3Ω/□ or less. Specifically, the surface resistance may be 1Ω/□ or less.

In a case in which any one surface resistance of the first electrode and the second electrode having a wide area is higher than a desired level, voltage may vary for each position of the electrode. Accordingly, when a potential difference between the first electrode and the second electrode disposed based on the organic layer varies, the luminance uniformity of the OLED may be degraded. Accordingly, in order to decrease the surface resistance of the first electrode or the second electrode that is higher than the desired level, the auxiliary electrode may be used. The surface resistance of the auxiliary electrode may be 3Ω/□ or less, and specifically, may be 1Ω/□ or less. In the above range, the luminance uniformity of the OLED may be maintained at a high level.

According to an exemplary embodiment of the present specification, the first electrode may be formed as a transparent electrode. In this case, the surface resistance of the first electrode may be higher than a surface resistance value suitable for driving the OLED. Accordingly, to decrease the surface resistance value of the first electrode, the surface resistance of the first electrode may be reduced to a surface resistance level of the auxiliary electrode by electrically connecting the auxiliary electrode and the first electrode.

According to an exemplary embodiment of the present specification, the auxiliary electrode may be provided on an area excluding a light emitting area. Specifically, the auxiliary electrode may be provided on the current carrying portion of the first electrode. Alternatively, in a case in which the current carrying portion of the first electrode is absent, the auxiliary electrode may be provided on an area in which the current carrying portion of the first electrode is to be positioned.

According to an exemplary embodiment of the present specification, the auxiliary electrode may include conductive lines that are electrically connected to each other. Specifically, the conductive lines may include conductive units. Specifically, it may be possible to drive an entire auxiliary electrode by applying a voltage to at least a portion of the auxiliary electrode.

According to an exemplary embodiment of the present specification, the OLED may be included in an OLED lighting and thereby used. In the case of the OLED light, it may be desirable to emit light having a uniform brightness from an entire light emitting area, that is, all of the OLEDs. Specifically, to achieve a uniform brightness in the OLED lighting, a voltage between the first electrode and the second electrode of each of all the OLEDs included in the OLED lighting may be maintained to be constant.

In a case in which the first electrode is a transparent electrode and the second electrode is a metal electrode, a surface resistance of the second electrode of each OLED is sufficiently low and thus, a voltage difference of the second electrode of each OLED barely exists. However, in the case of the first electrode, a voltage difference of each OLED may be present. According to an exemplary embodiment of the present specification, the auxiliary electrode, specifically, a metal auxiliary electrode may be used to compensate for such a voltage difference of the first electrode of each OLED. Further, the metal auxiliary electrode may include conductive lines that are electrically connected to each other, thereby enabling the voltage difference of the first electrode of each OLED to barely exist.

According to an exemplary embodiment of the present specification, the OLED may include a short-circuit preventing layer provided between the first electrode and the auxiliary electrode, and the auxiliary electrode may be electrically connected to the conductive unit through the short-circuit preventing layer. That is, the auxiliary electrode may be electrically connected to the conductive unit through the short-circuit preventing layer. The short-circuit preventing layer may perform a short-circuit preventing function of the OLED.

According to an exemplary embodiment of the present specification, the short-circuit preventing layer may be provided on at least one surface of the auxiliary electrode in contact therewith. Specifically, according to an exemplary embodiment of the present specification, the short-circuit preventing layer may be provided on a top surface, a bottom surface, or a side surface on which the auxiliary electrode is formed.

The short-circuit preventing layer may be applied together with the conductive connector and thereby perform a short-circuit preventing function of the OLED. Also, even when the conductive connector is absent, the short-circuit preventing layer alone may perform a short-circuit preventing function of the OLED.

The short-circuit preventing layer may be provided on the current carrying portion of the first electrode. Alternatively, when the first electrode includes only at least two conductive units, the short-circuit preventing layer may be provided to contact with one area of the conductive units.

According to an exemplary embodiment of the present specification, due to an increase in resistance resulting from the short-circuit preventing layer, the resistance between the auxiliary electrode and the conductive unit electrically connected through the short-circuit preventing layer may be 1,000Ω or more and 300,000Ω or less. According to an exemplary embodiment of the present specification, resistance from the auxiliary electrode of the short-circuit preventing layer to the first electrode may be 1,000Ω or more and 300,000Ω or less. Specifically, the resistance from the auxiliary electrode of the short-circuit preventing layer to the first electrode may be resistance from the auxiliary electrode to any one conductive connector.

According to an exemplary embodiment of the present specification, the thickness of the short-circuit preventing layer may be 1 nm or more and 10 μm or less.

The short-circuit preventing layer within the thickness range and/or the thickness direction resistance range may maintain normal operating voltage in a case in which the short circuit does not occur in the OLED. Also, even though the short circuit occurs in the OLED within the thickness range and/or the resistance range, the OLED may operate within the normal range.

Specifically, according to an exemplary embodiment of the present specification, resistance of the short-circuit preventing layer indicates resistance from the auxiliary electrode to the conductive connector or the conductive unit. Alternatively, according to an exemplary embodiment of the present specification, the resistance of the short-circuit preventing layer indicates resistance from the auxiliary electrode to the current carrying portion of the first electrode. That is, the resistance of the short-circuit preventing layer indicates resistance according to an electrical distance for electrical connection from the auxiliary electrode to the conductive connector or the conductive unit.

According to an exemplary embodiment of the present specification, the volume resistivity ($\rho_{slp}$) (Ωcm) of the short-circuit preventing layer may be calculated according to the following formula.

$$\rho_{spl} = \frac{R_{cell-spl} \times A_{spl}}{t_{spl}}$$

$A_{spl}(cm^2)$ denotes an area in which electricity may flow in a thickness direction from the auxiliary electrode formed on one conductive unit to one conductive unit through the short-circuit preventing layer. That is, $A_{spl}(cm^2)$ denotes an area overlapping an area of the auxiliary electrode formed on the short-circuit preventing layer in an area of the short-circuit preventing layer formed on one first electrode.

$R_{cell-spl}$ denotes resistance (Ω) of the short-circuit preventing portion in one conductive unit.

$t_{slp}(\mu m)$ may denote a thickness of the short-circuit preventing layer. Alternatively, $t_{slp}(\mu m)$ may denote the shortest distance in which electricity moves from the auxiliary electrode to the conductive connector or the conductive unit.

The thickness direction exemplifies an example in which the electricity moves in the short-circuit preventing layer and indicates a direction in which the electricity moves from one area of the short-circuit preventing layer to another area thereof.

Specifically, $A_{spl}(cm^2)$ may denote an area of the short-circuit preventing layer simultaneously overlapping the first electrode formed thereon and the auxiliary electrode formed therebelow in a case in which the short-circuit preventing layer is positioned between the first electrode and the auxiliary electrode. As an example, in a case in which the entire bottom surface of the short-circuit preventing layer is formed on the first electrode in contact therewith and the auxiliary electrode is formed on the entire top surface of the short-circuit preventing layer in contact therewith, $A_{spl}(cm^2)$ may be an area of the short-circuit preventing layer overlapping the first electrode. As another example, in a case in which the entire bottom surface of the short-circuit preventing layer is formed on the first electrode in contact therewith and the auxiliary electrode is formed on a portion of the top surface of the short-circuit preventing layer, $A_{spl}(cm^2)$ may be an area of the short-circuit preventing layer simultaneously overlapping the first electrode and the auxiliary electrode.

As it can be known from the above formula, the volume resistivity ($\rho_{slp}$) of the short-circuit preventing layer formed on one conductive unit may be determined based on the thickness direction resistance ($R_{cell-spl}$) of the short-circuit preventing layer in one conductive unit, the area ($A_{spl}$) in which the electricity may flow in the thickness direction from the auxiliary electrode formed on one conductive unit to one conductive unit through the short-circuit preventing layer, and the thickness ($t_{slp}$) of the short-circuit preventing layer.

According to an exemplary embodiment of the present specification, the volume resistivity of the short-circuit preventing layer may be 9 Ωcm or more and $8.1\times10^{10}$ Ωcm or less. Within the above range, the short-circuit preventing layer may maintain normal operating voltage in a case in which the short-circuit does not occur in the OLED. Also, the short-circuit preventing layer may perform a short-circuit preventing function. Even through the short circuit occurs, the OLED may operate within the normal range. The volume resistivity may be calculated as follows.

According to an exemplary embodiment of the present specification, in a case in which a range of the resistance of the short-circuit preventing layer is 1,000Ω or more and 300,000Ω or less, the thickness of the short-circuit preventing layer is 1 nm or more and 10 μm or less, and an area of one cell is 300×300 μm² to 3×3 mm², the area ($A_{spl}$) in which the electricity may flow in the thickness direction from the auxiliary electrode formed on one cell to the first electrode of one cell through the short-circuit preventing layer may be determined within the range of 1% to 30% of the area of one cell. Accordingly, the area ($A_{spl}$) in which the electricity may flow in the thickness direction from the auxiliary electrode formed on one cell to the first electrode of one cell through the short-circuit preventing layer may be $9\times10^{-6}$ cm² (300 μm×300 μm×0.01) to $2.7\times10^{-2}$ cm² (0.3 cm×0.3 cm×0.3). In this case, the volume resistivity of the short-circuit preventing layer may be calculated according to the following formula.

$$\frac{1,000\ \Omega \times 9 \times 10^{-6}\ cm^2}{10\ \mu m} \leq \rho_{spl} \leq \frac{300,000\ \Omega \times 2.7 \times 10^{-2}\ cm^2}{0.001\ \mu m}$$

According to an exemplary embodiment of the present specification, the short-circuit preventing layer may include one or more selected from a group including carbon powder; carbon film; conductive polymer; organic polymer; metal; metal oxide; inorganic oxide; metal sulfide; and insulating material. Specifically, a mixture of at least two selected from zirconium oxide ($ZrO_2$), nichrome, indium tin oxide (ITO), zinc sulfide (ZnS), and silicon dioxide ($SiO_2$) may be used.

According to an exemplary embodiment of the present specification, the surface resistance of the conductive unit may be 1Ω/□ or more, or may be 3Ω/□ or more, and particularly, may be 10Ω/□ or more. Also, the surface resistance of the conductive unit may be 10,000Ω/□ or less, or may be 1,000Ω/□ or less. That is, the surface resistance of the conductive unit may be 1Ω/□ or more and 10,000Ω/□ or less, or may be 10Ω/□ or more and 1,000Ω/□ or less.

The conductive unit and the conductive connector may be formed by patterning the first electrode and thus, the surface resistance of the conductive unit may be identical to the surface resistance of the first electrode or the conductive connector.

According to an exemplary embodiment of the present specification, a surface resistance level suitable for the conductive unit may be controlled to be in an inverse proportion to an area of the conductive unit corresponding to a light emitting area. For example, when the conductive unit has a light emitting area corresponding to an area of 100 cm², the surface resistance suitable for the conductive unit may be around 1Ω/□. Further, in the case of forming an area of each conductive unit to be small, the surface resistance suitable for the conductive unit may be 1Ω/□ or more.

The surface resistance of the conductive unit may be determined based on a material for forming the conductive unit, and may also be decreased to a surface resistance level of the auxiliary electrode through being electrically connected to the auxiliary electrode. Accordingly, a surface resistance value of the conductive unit suitable for the OLED may be adjusted based on a material of the auxiliary electrode and the conductive unit.

According to an exemplary embodiment of the present specification, the first electrode may include 1,000 or more conductive units separate from each other. Specifically, the first electrode may include 1,000 or more and 1,000,000 or less conductive units separate from each other.

Also, according to an exemplary embodiment of the present specification, the first electrode may be formed in a pattern of at least two conductive units. Specifically, the conductive unit may be formed in a pattern in which areas excluding the conductive connector are separate from each other.

The pattern of the conductive unit may have a shape of a closed figure. Specifically, the pattern may be provided in a polygonal shape, such as a triangular shape, a rectangular shape, and a hexagonal shape, and may be provided in an amorphous shape.

When the number of conductive units is 1,000 or more, it may be possible to reduce or minimize a leakage current amount in the case of the short-circuit occurrence while reducing or minimizing a voltage increase level in the case of the normal operation of the OLED. Also, as the number of conductive units increases up to 1,000,000, the above effects may be maintained while maintaining an aperture ratio. That is, when the number of conductive units exceeds 1,000,000, the aperture ratio may be degraded due to an increase in the number of auxiliary electrodes.

According to an exemplary embodiment of the present specification, an occupying area of the conductive units in the OLED may be 50% or more and 90% or less based on a top view of an entire OLED. Specifically, the conductive unit is included in the light emitting area and the occupying area of the conductive units based on a surface on which the entire OLED emits light may be the same as or similar to an aperture ratio of the OLED.

In the case of the first electrode, the respective conductive units are electrically connected by the conductive connector and/or the short-circuit preventing layer and thus, driving voltage of the OLED increases. Therefore, according to an exemplary embodiment of the present specification, the first electrode includes 1,000 or more conductive units to supplement an increase in the driving voltage by the conductive connector. As a result, it may be possible to decrease the driving voltage of the OLED and at the same time, to enable the first electrode to have a short-circuit preventing function by the conductive connector.

According to an exemplary embodiment of the present specification, an area of each conductive unit may be 0.01 mm² or more and 25 mm² or less.

In the case of reducing the area of each conductive unit, it may be possible to simultaneously decrease an operating voltage increase rate according to the conductive connector introduced for short-circuit prevention and a value of operating current to leakage current. Also, in a case in which a non-emitting conductive unit is present due to the occurrence of short circuit, it may be possible to minimize a decrease in the product quality by minimizing the non-emitting area. Here, in the case of significantly reducing the area of the conductive unit, a ratio of the emitting area in the OLED may significantly decrease and thus, the efficiency of the OLED may be degraded due to a decrease in the aperture ratio. Accordingly, in the case of manufacturing the OLED using the area of the conductive unit, it may be possible to reduce or minimize the aforementioned disadvantages, while maintaining the aforementioned advantages.

According to the OLED according to an exemplary embodiment of the present specification, the short-circuit preventing portion, the conductive unit, and the organic layer including the light emitting layer may be electrically connected in series to each other. The light emitting layer may be positioned between the first electrode and the second electrode. Each of at least two light emitting layers may be electrically connected in parallel.

According to an exemplary embodiment of the present specification, the light emitting layer may be positioned between the conductive unit and the second electrode, and each light emitting layer may be electrically connected in parallel to each other. That is, the light emitting layer may be positioned to correspond to an area corresponding to the conductive unit.

In a case in which the light emitting layer operates in the same current density, a resistance value increases in inverse proportion to a decrease in an area of the light emitting layer. According to an exemplary embodiment of the present specification, in a case in which an area of each conductive unit decreases and the number of conductive units increases, an area of each light emitting layer also decreases. In this case, in a case in which the OLED operates, a ratio of voltage of the conductive connectors connected in series to the organic layer decreases compared to voltage applied to the organic layer including the light emitting layer.

In a case in which a short circuit occurs in the OLED according to an exemplary embodiment of the present specification, a leakage current amount may be determined based on a resistance value from the auxiliary electrode to the conductive unit and operating voltage, regardless of the number of conductive units. Accordingly, when increasing the number of conductive units, it may be possible to reduce or minimize a voltage increase phenomenon by the conductive connector in the case of the normal operation, while reducing or minimizing a leakage current amount in the case of the short-circuit occurrence.

According to an exemplary embodiment of the present specification, the OLED may further include a substrate and the first electrode may be provided on the substrate.

According to an exemplary embodiment of the present specification, the first electrode may be a transparent electrode.

When the first electrode is the transparent electrode, the first electrode may be manufactured using conductive oxide such as indium tin oxide (ITO) or indium zinc oxide (IZO). Further, the first electrode may also be a translucent electrode. When the first electrode is the translucent electrode, the first electrode may be manufactured using a translucent metal such as Ag, Au, Mg, Ca, or the alloy thereof. When the translucent metal is used for the first electrode, the OLED may have a micro-cavity structure.

According to an exemplary embodiment of the present specification, the auxiliary electrode may be formed of a metal material. That is, the auxiliary electrode may be a metal electrode.

The auxiliary electrode may be formed of any type of metals. Specifically, the metals may include aluminum, copper, and/or silver having an excellent conductivity. In the case of using aluminum for stability during an adhesive power and photolithography process with a transparent electrode, the auxiliary electrode may also use a layer of molybdenum/aluminum/molybdenum.

According to an exemplary embodiment of the present specification, the organic layer may include at least one light emitting layer and may further include one or more selected from a group including a hole injecting layer; a hole transporting layer; a hole preventing layer; a charge generating layer; an electron preventing layer; an electron transporting layer; and an electron injecting layer.

The charge generating layer refers to a layer in which holes and electrons are generated when a voltage is applied thereto.

The substrate may use a substrate having a good transparency, surface smoothness, easy handling and waterproof. Specifically, the substrate may use a glass substrate, a thin film glass substrate or a transparent plastic substrate. A film, such as polyethylene terephthalate (PET), polyethylene naphthalate (PEN), polyether ether ketone (PEEK), and polyimide (PI), may be included in the plastic substrate in a form of a single layer or a plurality of layers. Also, the substrate may autonomously include a light scattering function. Here, the substrate is not limited thereto and may use a substrate generally used for the OLED.

According to an exemplary embodiment of the present specification, the first electrode may be an anode and the second electrode may be a cathode. Also, the first electrode may be the cathode and the second electrode may be the anode.

A material having a high work function may be used for the anode so that hole injection into the organic layer may be smoothly performed. Specific examples of an anode material may include a metal such as vanadium, chrome, copper, zinc, and gold, or the alloy thereof; metal oxide such as zinc oxide, indium oxide, indium tin oxide (ITO), and indium zinc oxide (IZO); a combination of a metal and oxide such as $ZnO:Al$ or $SnO_2:Sb$; conductive polymer such as poly(3-methylthophene), poly[3,4-(ethylene-1,2-dioxy)thiophene] (PEDT), polypyrrole, and polyaniline, and the like, but are not limited thereto.

The anode material is not limited only to the anode and may be used as a material of the cathode.

A material having a low work function may be used for the cathode so that electron injection into the organic layer may be smoothly performed. Specific example of a cathode material may include a metal such as magnesium, calcium, sodium, potassium, titanium, indium, yttrium, lithium, gadolinium, aluminum, silver, tin, and lead, or the alloy thereof; a multi-structured material such as LiF/Al or $LiO_2$/Al, and the like, but are not limited thereto.

The cathode material is not limited only to the cathode and may be used as a material of the anode.

A material having a high mobility with respect to holes may be suitable for a material of the hole transporting layer according to an exemplary embodiment of the present specification, which is a material capable of receiving a hole from the anode or the hole injecting layer and transporting the hole to the light emitting layer. Specific examples thereof may include an arylamine-based organic material, conductive polymer, and block copolymer in which a conjugate portion and a non-conjugate portion are present together, but are limited thereto.

A material having a high quantum efficiency with respect to fluorescence or phosphorescence may be suitable for a material of the light emitting layer according to an exemplary embodiment of the present specification, which is a material capable of emitting light of a visible area by receiving holes and electrons from the hole transporting layer and the electron transporting layer, respectively, and thereby combining the holes and the electrons. Specific examples thereof may include 8-hydroxy-quinoline aluminum complex ($Alq_3$); carbazole-based compound; dimerized styryl compound; BAlq; 10-hydroxy benzoquinoline-metal compound; benzoxazole, benzthiazole and bezimidazole-based compound; poly(p-phenylenevinylene) (PPV) based polymer; spiro compound; polyfluorrene; rubrenes, and the like, but are not limited thereto.

A material having a high mobility with respect to electrons may be suitable for a material of the electron transporting layer according to an exemplary embodiment of the present specification, which is a material capable of receiving electrons injected from the cathode and transporting the electrons to the light emitting layer. Specific examples thereof may include Al complex of 8-hydroxyquinoline; complex including $Alq_3$; organic radical compound; hydroxyflavone-metal complex, and the like, but are not limited thereto.

According to an exemplary embodiment of the present specification, the auxiliary electrode may be positioned on a non-emitting area of the OLED.

According to an exemplary embodiment of the present specification, the OLED may further include an insulating layer provided on the non-emitting area.

According to an exemplary embodiment of the present specification, the insulating layer may insulate the short-circuit preventing portion and the auxiliary electrode from the organic layer.

According to an exemplary embodiment of the present specification, the OLED may be sealed with an encapsulating layer.

The encapsulating layer may be formed as a transparent resin layer. The encapsulating layer may function to protect the OLED from oxygen and pollutant materials and may be formed of a transparent material in order not to degrade the luminescence of the OLED. The transparency indicates transmitting 60% or more of light. Specifically, the transparency indicates transmitting 75% or more of light.

According to an exemplary embodiment of the present specification, the OLED may further include a light scattering layer. Specifically, according to an exemplary embodiment of the present specification, the OLED may further include a substrate on a surface facing a surface on which the organic layer of the first electrode is provided, and may further include the light scattering layer provided between the substrate and the first electrode. According to an exemplary embodiment of the present specification, the light scattering layer may include a flattening layer. According to an exemplary embodiment of the present specification, the flattening layer may be provided between the first electrode and the light scattering layer.

Alternatively, according to an exemplary embodiment of the present specification, the OLED may further include a substrate on the surface facing the surface on which the organic layer of the first electrode is provided, and may further include a light scattering layer provided on a surface facing a surface on which the first electrode of the substrate is provided.

According to an exemplary embodiment of the present specification, if the light scattering layer is provided in a structure capable of improving a light extraction efficiency of the OLED by inducing light scattering, the light scattering layer is not particularly limited. Specifically, according to an exemplary embodiment of the present specification, the light scattering layer may be provided in a structure in which scattering particles are distributed within a binder, a film having an unevenness, and/or a film having haziness.

According to an exemplary embodiment of the present specification, the light scattering light may be directly formed on the substrate using a method such as spin coating, bar coating, and slit coating, or may be formed using a method of manufacturing the light scattering layer in a film form and thereby attaching the same.

According to an exemplary embodiment of the present specification, the OLED may be a flexible OLED. In this case, the substrate may include a flexible material. Specifically, the substrate may be a bendable thin-film glass substrate, a plastic substrate, or a film type substrate.

A material of the plastic substrate is not particularly limited, but may generally include a film, such as polyethylene terephthalate (PET), polyethylene naphthalate (PEN), polyether ether ketone (PEEK), and polyimide (PI), in a form of a single layer or a plurality of layers.

An exemplary embodiment of the present specification provides a display device including an OLED. In the display device, the OLED may function as a pixel or a backlight. In addition, various configurations known in the art can be applied to the display device.

An exemplary embodiment of the present specification provides a lighting device including an OLED. In the lighting device, the OLED may function as a light emitter. In addition, various configurations known in the art may be applied to the lighting device.

An exemplary embodiment of the present specification provides a method for manufacturing the OLED. Specifically, the exemplary embodiment of the present specification provides the method for manufacturing the OLED, the method including preparing a substrate; forming a first electrode including at least two conductive units on the substrate; forming an auxiliary electrode disposed to be separate from the conductive units and at least two branch points each having at least three branches; forming at least one organic layer on the first electrode; and forming a second electrode on the organic layer.

According to an exemplary embodiment of the present specification, the forming of the first electrode may form the first electrode to include at least two conductive units and a conductive connector connected to each conductive unit.

According to an exemplary embodiment of the present specification, the forming of the auxiliary electrode may form the auxiliary electrode on one end portion of each conductive connector.

According to an exemplary embodiment of the present specification, the method for manufacturing the OLED may further include forming a short-circuit preventing layer to be provided between the first electrode and the auxiliary electrode during a period between the forming of the first electrode and the forming of the auxiliary electrode.

According to an exemplary embodiment of the present specification, the OLED may emit a white light having a color temperature of 2,000 K or more and 12,000 K or less.

Hereinafter, Examples will be described in detail to specifically describe embodiments of the present specification. However, these Examples can be modified in various different forms or configurations and thus, should not be interpreted in limiting the scope of the present specification.

EXAMPLE

A light emitting area was manufactured to be 40×40 mm$^2$ by forming the first electrode on the substrate using ITO.

Here, the surface resistance of ITO was 10Ω/□. The auxiliary electrode was formed to be in a mesh form of surrounding the light emitting area with a width of 20 μm and a thickness of 500 nm using copper (Cu). Also, an interval of the auxiliary electrode was manufactured to be about 0.82 mm. Also, the conductive connector was manufactured to have a length of 1560 μm, a width of 20 μm, and resistance of 780Ω or more. Also, an area of each conductive unit was manufactured to be 0.56 mm². The number of conductive units included in the manufactured OLED was 49×49 (2410 conductive units). In the manufactured OLED, aside from an ITO area corresponding to the light emitting area, an area in which a metal auxiliary electrode is exposed and an area in which ITO is patterned and thereby removed were insulated using a photosensitive insulating material.

A white OLED having the light emitting area of 40×40 mm² was manufactured by sequentially stacking the organic layer including the light emitting layer and the second electrode.

Aluminum (Al) was used for the second electrode, and the organic layer was formed in a structure of including a hole injecting layer, a hole transporting layer, an organic light emitting layer, an electron transporting layer, and an electron injecting layer. The organic light emitting layer was formed in a double-layered structure including a blue light emitting layer using a fluorescent material and a green and red light emitting layer using a phosphorescent material. The material used for each stack structure has used a material generally used in a manufacturing field of the white OLED. The manufacturing method has also used a generally used method.

Comparative Example

Except for that the auxiliary electrode was formed to be in parallel with a line width of 20 μm and the auxiliary electrode connected in a parallel form with a metal line formed on an outer edge area of 40 mm×40 mm was formed in a striped shape, the white OLED was manufactured based on the same conditions as Example 1.

FIG. 8 illustrates a partial area of a state in which a first electrode and an auxiliary electrode are formed during a manufacturing process of an OLED manufactured according to an Example of the present specification and a Comparative Example. In FIG. 8, the auxiliary electrode of the OLED (e) manufactured according to the Comparative Example was formed in a stripe shape, and the auxiliary electrode of the OLED (f) manufactured according to the Example was formed in a mesh shape.

FIG. 9 illustrates a state after causing a short-circuit defect to an OLED manufactured according to the Example and the Comparative Example. Referring to FIG. 9, it can be observed from the OLED (g) manufactured according to the Comparative Example that luminescence intensity is decreased in a portion around a short-circuit occurrence area due to a voltage drop (IR drop) phenomenon. On the contrary thereto, it can be verified from the OLED (h) manufactured according to the Example that luminescence does not occur only in the short-circuit occurrence area and the luminescence intensity is not degraded in the portion around the short-circuit occurrence area.

In the case of the OLED manufactured according to the Comparative Example, the efficiency was a level of 60 lm/W. Operating voltage was 6 V and operating current density was about 3 mA/cm². The conductive unit was connected to one metal auxiliary electrode having the line width of 20 μm at an interval of about 850 μm. The number of conductive units was 49×49 (2401 conductive units). Further, in a state in which the short-circuit defect is not generated, an amount of current flowing from one conductive unit through the second electrode may be calculated to be (4 cm×4 cm×3 mA/cm²)/2401=0.02 mA. In the OLED manufactured according to the Comparative Example, the auxiliary electrode was formed to have a width of 20 μm, a thickness of 500 nm, and a length of 40 nm using Cu. Resistance of both ends of the auxiliary electrode was 67Ω.

Figure 10:
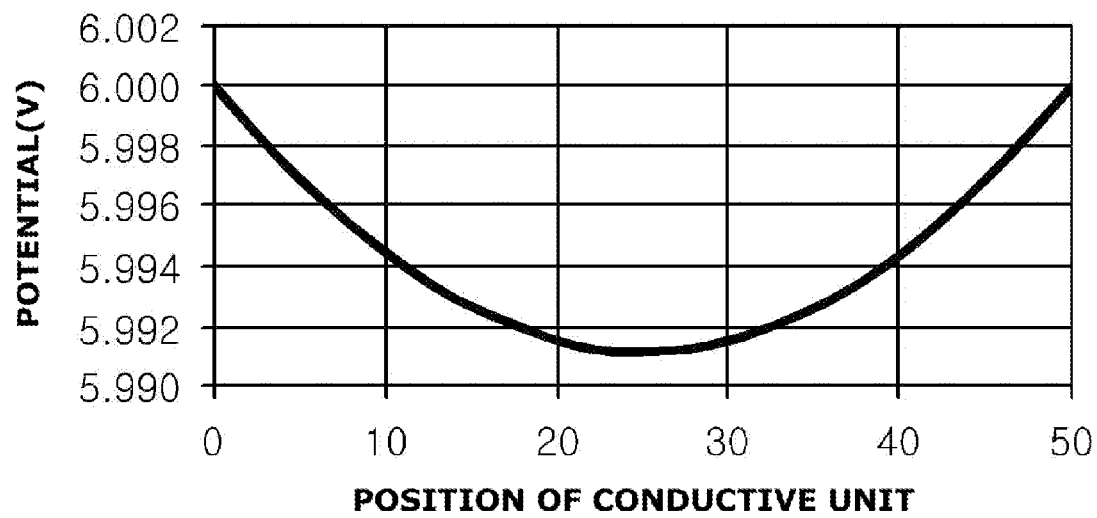
FIG. 10 illustrates potential of an auxiliary electrode per position in a case in which a short circuit has not occurred in an OLED according to a Comparative Example.

FIG. 10 shows potential of an auxiliary electrode per position in a case in which a short circuit defect has not occurred in an OLED according to a Comparative Example. That is, FIG. 10 shows voltage of the auxiliary electrode per position of the conductive unit in a case in which the short circuit has not occurred, current for operation of the OLED according to the Comparative Example was injected into only both ends of the auxiliary electrode and flew into the organic layer and the second electrode through each conductive unit connected to the auxiliary electrode.

Referring to FIG. 10, a position at which the maximum voltage drop has occurred in the auxiliary electrode was a center point of the OLED that is farthest away from an edge point of the auxiliary electrode, and the voltage drop at the center point of the OLED was about 0.009 V.

In a case in which the short-circuit defect has occurred in the 25$^{th}$ conductive unit from the edge point of the OLED according to the Comparative Example, when the operating voltage is 6V and resistance of the conductive connector connected to the conductive unit in which the short circuit has occurred is 780Ω, an amount of leakage current was 7.7 mA (6 V/780Ω).

Figure 11:
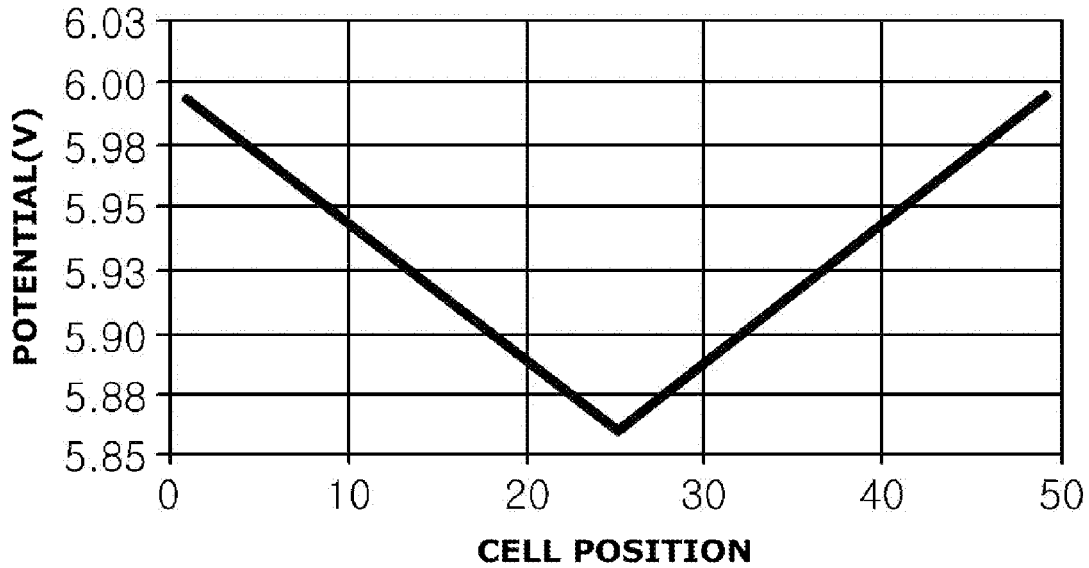
FIG. 11 illustrates potential of an auxiliary electrode per position in a case in which a short circuit has occurred in an OLED according to a Comparative Example.

FIG. 11 shows potential of an auxiliary electrode per position in a case in which a short circuit has occurred in an OLED according to the Comparative Example.

Referring to FIG. 11, in a case in which the short circuit has occurred in the OLED according to the Comparative Example, the voltage drop was about 0.13V and thus, voltage drop of about 10 folds compared to a normal operation has occurred. Accordingly, in a short-circuit occurrence area, voltage of the first electrode and voltage of the second electrode have a value lower by about 0.13V than 6V that is input voltage. Accordingly, an amount of current flowing in the organic layer formed around the short-circuit occurrence area also decreases, which results in decreasing luminescence intensity.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting device (OLED), comprising:
   a first electrode including at least two conductive units that are immediately adjacent to each other;
   a second electrode facing the first electrode;
   an organic layer between the first electrode and the second electrode;
   an auxiliary electrode electrically connected to the first electrode, the auxiliary electrode including at least two branch points that are immediately adjacent to each other, each branch point having at least three branches; and
   a short-circuit preventing portion between the at least two conductive units and the auxiliary electrode, wherein the at least two conductive units and the auxiliary electrode are electrically connected through each of the short-circuit preventing portion, wherein a resistance between the at least two branch points is 35Ω or less, and wherein a resistance between the at least two conductive units is 2,000Ω or more and 600,000Ω or less.

2. The OLED according to claim 1, wherein the auxiliary electrode has a mesh structure surrounding each of the at least two conductive units.

3. The OLED according to claim 1, wherein a distance between the at least two branch points of the auxiliary electrode is 21 mm or less.

4. The OLED according to claim 1, wherein a distance between the at least two branch points of the auxiliary electrode is 10 mm or less, and wherein a resistance between the at least two branch points of the auxiliary electrode is 18Ω or less.

5. The OLED according to claim 1, wherein each conductive unit is electrically connected to the auxiliary electrode in parallel.

6. The OLED according to claim 1, wherein the short-circuit preventing portion includes a conductive connector, a short-circuit preventing layer, or the conductive connector and the short-circuit preventing layer.

7. The OLED according to claim 1, wherein at a current density of any one value of 1 mA/cm² to 5 mA/cm², the short-circuit preventing portion has a resistance value at which an operating voltage increase rate of the following Formula 1 and a numerical value of operating current to leakage current of the following Formula 2 simultaneously satisfy 0.03 or less:

$$\frac{V_t - V_o}{V_o} \quad \text{[Formula 1]}$$

$$\frac{I_s}{I_t} \quad \text{[Formula 2]}$$

wherein $V_t(V)$ denotes an operating voltage of the OLED to which the short-circuit preventing portion is applied and in which a short circuit defect is absent, $V_o(V)$ denotes an operating voltage of the OLED to which the short-circuit preventing portion is not applied and in which the short-circuit defect is absent, $I_t(mA)$ denotes an operating current of the OLED to which the short-circuit preventing portion is applied and in which the short-circuit defect is absent, and $I_s(mA)$ denotes a leakage current of the OLED to which the short-circuit preventing portion is applied and in which the short-circuit defect is present in any one conductive unit.

8. The OLED according to claim 1, wherein a resistance from each conductive unit to the auxiliary electrode is 1,000Ω or more and 300,000Ω or less.

9. The OLED according to claim 1, wherein the first electrode further includes-at least two conductive connectors each including an area in which a length of a direction in which current substantially flows is longer than a width of a vertical direction thereof, and one end portion of each conductive connector is electrically connected to one of the at least two conductive units, and another end portion thereof is electrically connected to the auxiliary electrode.

10. The OLED according to claim 9, wherein the auxiliary electrode is disposed to be separated from the at least two conductive units; and an area excluding the end portion of the each conductive connector in contact with the auxiliary electrode.

11. The OLED according to claim 9, wherein each conductive connector includes an area in which a ratio of the length to the width is about 10:1 or more.

12. The OLED according to claim 9, wherein resistance of each conductive connector satisfies the following Formula 3:

(length of conductive connector ÷ width of conductive connector) x surface resistance of conductive connector ≥1,000Ω   [Formula 3].

13. The OLED according to claim 9, wherein the first electrode further includes a current carrying portion of the first electrode electrically connected to the conductive connectors, and the auxiliary electrode is electrically connected to the conductive connectors through the current carrying portion of the first electrode.

14. The OLED according to claim 6, wherein the short-circuit preventing portion includes the short-circuit preventing layer, which is provided on at least a one surface of the auxiliary electrode in contact therewith.

15. The OLED according to claim 6, wherein the short-circuit preventing portion includes the short-circuit preventing layer, which is provided on a top surface, a bottom surface, or a side surface on which the auxiliary electrode is formed.

16. The OLED according to claim 6, wherein the short-circuit preventing portion includes the short-circuit preventing layer, and wherein a thickness of the short-circuit preventing layer is 1 nm or more and 10 μm or less.

17. The OLED according to claim 6, wherein the short-circuit preventing portion includes the short-circuit preventing layer, and wherein a volume resistivity of the short-circuit preventing layer is 9 Ωcm or more and 8.1 ×10¹⁰ Ωcm or less.

18. The OLED according to claim 6, wherein the short-circuit preventing portion includes the short-circuit preventing layer, and wherein the short-circuit preventing layer includes one or more selected from a group consisting of a carbon powder; a carbon film; a conductive polymer; an organic polymer; a metal; a metal oxide; an inorganic oxide; a metal sulfide; and an insulating material.

19. The OLED according to claim 1, further comprising: a substrate,
wherein the first electrode is provided on the substrate.

20. The OLED according to claim 1, wherein a surface resistance of each conductive unit is 1Ω/☐ or more.

21. The OLED according to claim 1, wherein the first electrode has 1,000 or more conductive units separated from each other.

22. The OLED according to claim 1, wherein a surface resistance of the auxiliary electrode is 3Ω/☐ or less.

23. The OLED according to claim 1, wherein the first electrode is a transparent electrode.

24. The OLED according to claim 1, wherein the auxiliary electrode is a metal electrode.

25. The OLED according to claim 1, wherein the organic layer further includes at least one light emitting layer and further includes one or more selected from a group consisting of a hole injecting layer; a hole transporting layer; a hole preventing layer; a charge generating layer; an electron preventing layer; an electron transporting layer; and an electron injecting layer.

26. The OLED according to claim 1, wherein the auxiliary electrode is positioned on a non-emitting area of the OLED.

27. The OLED according to claim 1, wherein the OLED emits a white light having a color temperature of 2,000 K or more and 12,000 K or less.

28. The OLED according to claim 1, further comprising:
a substrate provided on a surface facing a surface on which an organic layer of the first electrode is provided; and
a light scattering layer provided between the substrate and the first electrode.

29. The OLED according to claim 28, wherein the light scattering layer includes a flattening layer.

30. The OLED according to claim 1, further comprising:
a substrate provided on a surface facing a surface on which an organic layer of the first electrode is provided; and
a light scattering layer provided on a surface facing a surface on which the first electrode of the substrate is provided.

31. The OLED according to claim 1, wherein the OLED is a flexible OLED.

32. The OLED according to claim 1, wherein the OLED is a display device or a lighting device.

33. A method for manufacturing an organic light emitting device (OLED), the method comprising:
forming a first electrode including at least two conductive units on a substrate;
forming an auxiliary electrode that is separate from the at least two conductive units and includes at least two branch points, each branch point having at least three branches;
forming an organic layer on the first electrode; and
forming a second electrode on the organic layer,
wherein the method further comprises forming a short-circuit preventing layer between the first electrode and the auxiliary electrode during a period between the forming of the first electrode and the forming of the auxiliary electrode.

34. The method according to claim 33, wherein the forming of the first electrode forms the first electrode that includes the at least two conductive units and a conductive connector connected to each conductive unit.

* * * * *